(12) United States Patent
Figueroa et al.

(10) Patent No.: US 6,388,207 B1
(45) Date of Patent: May 14, 2002

(54) ELECTRONIC ASSEMBLY WITH TRENCH STRUCTURES AND METHODS OF MANUFACTURE

(75) Inventors: David G. Figueroa; Michael Walk, both of Mesa; Yuan-Liang Li, Chandler; Robert L. Sankman, Phoenix, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/751,356

(22) Filed: Dec. 29, 2000

(51) Int. Cl.[7] .............................................. H01R 23/68
(52) U.S. Cl. ..................... 174/262; 174/261; 257/692; 257/698; 257/773; 361/760
(58) Field of Search ................................ 174/262, 261, 174/264; 301/700, 752; 257/692, 774, 781, 737, 738, 773; 439/71; 361/748

(56) References Cited

U.S. PATENT DOCUMENTS

| | | | |
|---|---|---|---|
| 4,349,862 A | 9/1982 | Bajorek et al. | 361/401 |
| 4,354,729 A | 10/1982 | Grabbe et al. | 339/258 R |
| 4,574,255 A | 3/1986 | Fujii et al. | 331/25 |
| 4,645,279 A | 2/1987 | Grabbe et al. | 339/17 CF |
| 4,699,593 A | 10/1987 | Grabbe et al. | 439/71 |
| 4,726,739 A | 2/1988 | Saitou et al. | 417/286 |
| 4,940,432 A | 7/1990 | Consoli et al. | 439/862 |
| 4,959,029 A | 9/1990 | Grabbe | 439/862 |
| 5,035,629 A | 7/1991 | Matsuoka | 439/70 |
| 5,286,208 A | 2/1994 | Matsuoka | 439/72 |
| 5,400,220 A * | 3/1995 | Swamy | 174/264 |
| 5,451,165 A * | 9/1995 | Cearley-Cabbiness et al. | 439/71 |
| 5,545,045 A | 8/1996 | Wakamatsu | 439/70 |
| 5,708,570 A | 1/1998 | Polinski, Sr. | 361/762 |
| 5,800,184 A | 9/1998 | Lopergolo et al. | 439/66 |
| 5,874,770 A | 2/1999 | Saia et al. | 257/536 |
| 6,028,497 A * | 2/2000 | Allen et al. | 257/698 |
| 6,075,285 A | 6/2000 | Taylor et al. | 257/691 |
| 6,153,290 A | 11/2000 | Sunahara | 428/210 |

OTHER PUBLICATIONS

Cotton, M., "Microfeatures & Embedded Coaxial Technology", *Electronic Circuits World Convention 8*, 6 p., (Sep. 8, 1999).

* cited by examiner

*Primary Examiner*—Albert W. Paladini
(74) *Attorney, Agent, or Firm*—Schwegman, Lundberg, Woessner & Kluth, P.A.

(57) ABSTRACT

To accommodate the operational and structural requirements of high performance integrated circuits, an integrated circuit package includes conductive trenches that are formed within a substrate. The trenches provide increased current carrying capacity, lower inductance, higher capacitance, and single and/or dual reference planes for signal conductors. Trench structures can be provided at various locations within the substrate, such as adjacent to signal conductors and embedded capacitors, as well as on the substrate periphery to couple the package to a socket. Trenches can be formed by routing, drilling, imprinting, and/or microperforation. Methods of fabrication, as well as application of the package to an electronic assembly and to an electronic system, are also described.

52 Claims, 12 Drawing Sheets

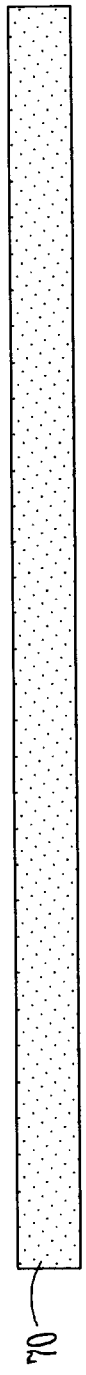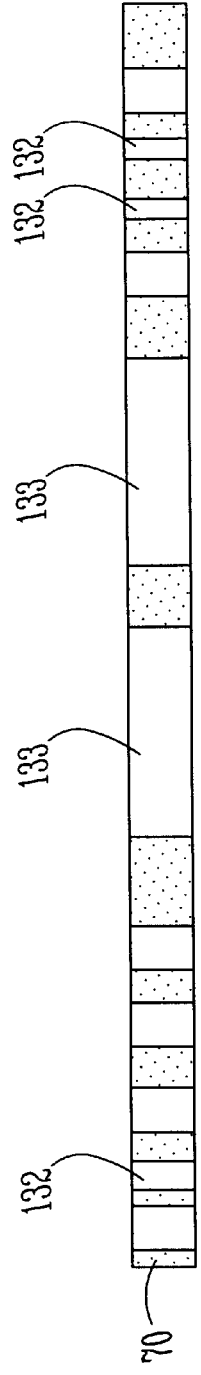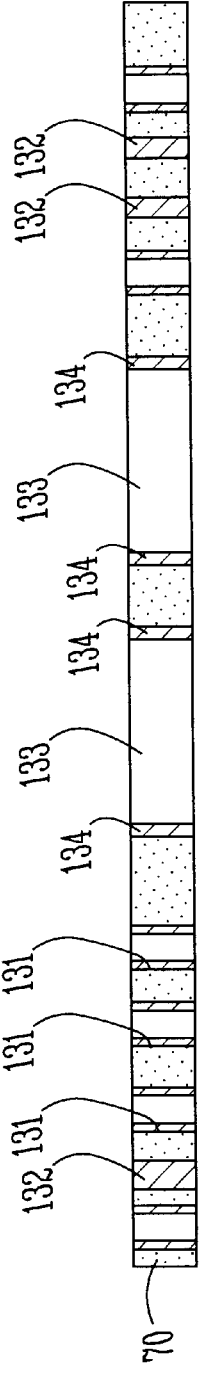

US 6,388,207 B1

ELECTRONIC ASSEMBLY WITH TRENCH STRUCTURES AND METHODS OF MANUFACTURE

RELATED INVENTIONS

The present invention is related to the following inventions which are assigned to the same assignee as the present invention:

Ser. No. 09/540,707, entitled "Discrete Device Socket and Method of Fabrication Therefor";

Ser. No. 09/606,882, entitled "Electronic Package Having Embedded Capacitors and Method of Fabrication Therefor";

Ser. No. 09/730,210, entitled "An Electronic Assembly Providing Shunting of Electrical Current"; and Ser. No. 09/735,956 entitled "Electronic Circuit Housing with Trench Vias and Method of Fabrication Therefor".

TECHNICAL FIELD OF THE INVENTION

The present invention relates generally to electronics packaging. More particularly, the present invention relates to an electronic assembly that includes a substrate comprising conductive trenches for providing improved power delivery and signal integrity, and for reducing inductance, in an integrated circuit package for a high performance integrated circuit, and to manufacturing methods related thereto.

BACKGROUND OF THE INVENTION

Integrated circuits (IC's) are typically assembled into packages by physically and electrically coupling them to a substrate made of organic or ceramic material. One or more IC's or IC packages can be physically and electrically coupled to a substrate such as a printed circuit board (PCB) or card to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of IC's on substrates, where each new generation of packaging must provide increased performance, particularly in terms of an increased number of components and higher clock frequencies, while generally being smaller or more compact in size.

An IC substrate may comprise a number of insulated metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as IC's, of the system. Some IC's have a relatively large number of input/output (I/O) terminals (also called "lands"), as well as a large number of power and ground terminals or lands. The large number of I/O, power, and ground terminals requires that the substrate contain a relatively large number of traces. Some substrates require multiple layers of traces to accommodate all of the system interconnections.

Traces located within different layers are typically connected electrically by vias (also called "plated throughholes") formed in the board. A via can be made by making a hole through some or all layers of a substrate and then plating the interior hole surface or filling the hole with an electrically conductive material, such as copper or tungsten.

One of the conventional methods for mounting an IC on a substrate is called "controlled collapse chip connect" (C4). In fabricating a C4 package, the electrically conductive terminations or lands (generally referred to as "electrical contacts") of an IC component are soldered directly to corresponding lands on the surface of the substrate using reflowable solder bumps or balls. The C4 process is widely used because of its robustness and simplicity.

As the internal circuitry of high performance ICs, such as processors, operates at higher and higher clock frequencies, and as ICs become more dense and operate at higher and higher power levels, a number of manufacturing and operational factors can reach unacceptable levels. These factors include manufacturing cost and complexity, package size, inductance and capacitance levels, heat dissipation, signal integrity, and product reliability.

For the reasons stated above, and for other reasons stated below which will become apparent to those skilled in the art upon reading and understanding the present specification, there is a significant need in the art for methods and structures for packaging a high performance IC on a substrate that provide increased power delivery and signal integrity, and decreased inductance levels.

BRIEF DESCRIPTION OF THE DRAWINGS

FIGS. 7–10 are cross-sectional representations illustrating stages of fabricating an IC package substrate, in accordance with an embodiment of the invention;

DETAILED DESCRIPTION OF EMBODIMENTS OF THE INVENTION

Figure 1:
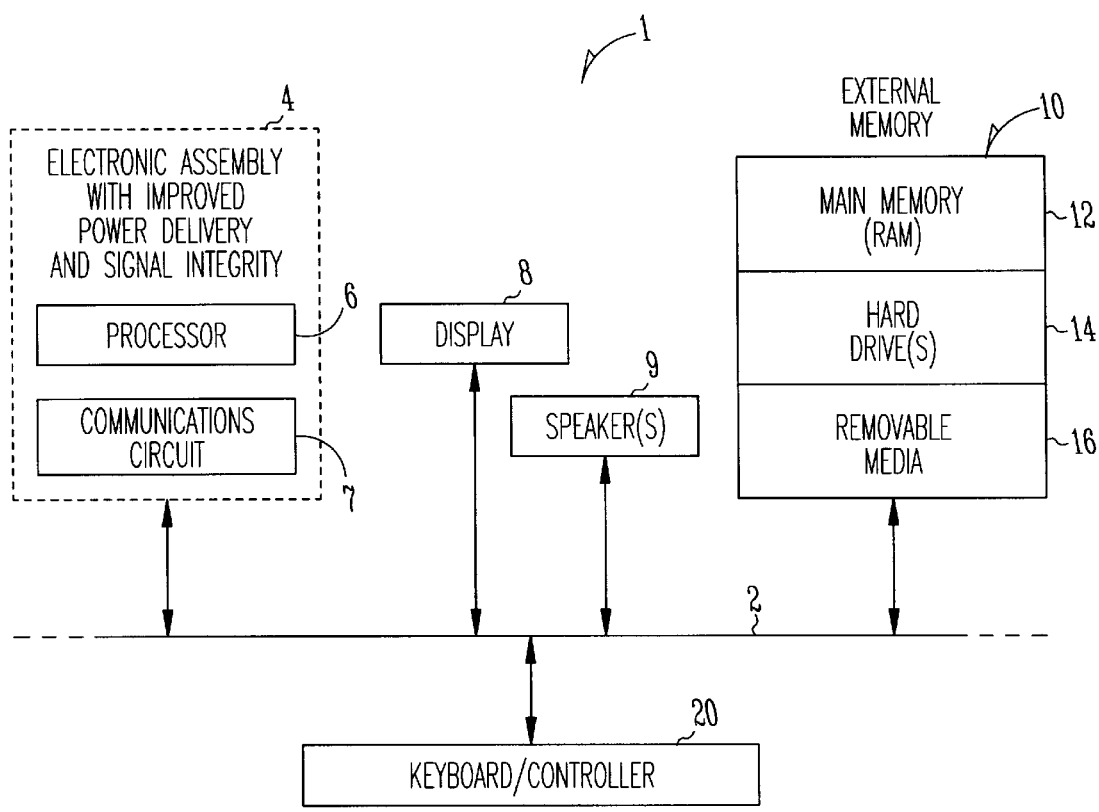
FIG. 1 is a block diagram of an electronic system incorporating at least one electronic assembly with improved power delivery and signal integrity in accordance with one embodiment of the invention.

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that structural, mechanical, compositional, and electrical changes may be made without departing from the spirit and scope of the present inventions. The following detailed description is, therefore, not to be taken in a limiting sense, and the scope of the present invention is defined only by the appended claims.

The present invention provides a solution to performance and reliability problems that are associated with prior art packaging of integrated circuits (IC's) that have high circuit density and that operate at high clock speeds and high power levels, by employing conductive trenches or planes within a substrate to which an IC is mounted. Trench structures are provided at various locations within the substrate. The trenches provide increased current carrying capacity, lower inductance, higher capacitance, and single and/or dual reference planes for signal conductors primarily in, but not limited to, microstrip or strip-line configurations.

Trenches can be provided, for example, adjacent to or surrounding signal conductors such as vias or plated through holes. These provide reference planes within the substrate that help signal integrity. Ordinarily, signal vias are only surrounded by other signal vias, but in the present invention signal vias can be surrounded by at least two planes that provide power-ground, power-power, or ground-ground references.

Trenches can also be positioned within the substrate to provide low resistance DC paths through the package core.

In addition, closely spaced trenches at a supply voltage alternating with trenches at a ground potential provide low inductance through the package core.

Trenches can be formed around embedded capacitors. Trenches or conductive planes having an exposed surface can also be formed on the substrate periphery to couple the package to a socket.

Various embodiments are illustrated and described herein.

In one embodiment, a front surface of an IC is flip-chip mounted to an organic land grid array (OLGA) substrate using "controlled collapse chip connect" (C4) technology. In one embodiment, the substrate core contains a plurality of conductive trenches or conductive planes at various locations within the substrate core. Some of the conductive trenches are at a supply potential, while others are at a ground potential. Some of the trenches surround capacitors that are embedded within the substrate. Other trenches are located adjacent to signal conductors such as signal vias. Yet other trenches are formed on the substrate periphery to provide suitable structure for coupling to a socket located, for example, on a higher level of packaging, such as a motherboard.

FIG. 1 is a block diagram of an electronic system 1 incorporating at least one electronic assembly 4 with improved power delivery and signal integrity in accordance with one embodiment of the invention. Electronic system 1 is merely one example of an electronic system in which the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Figure 2:
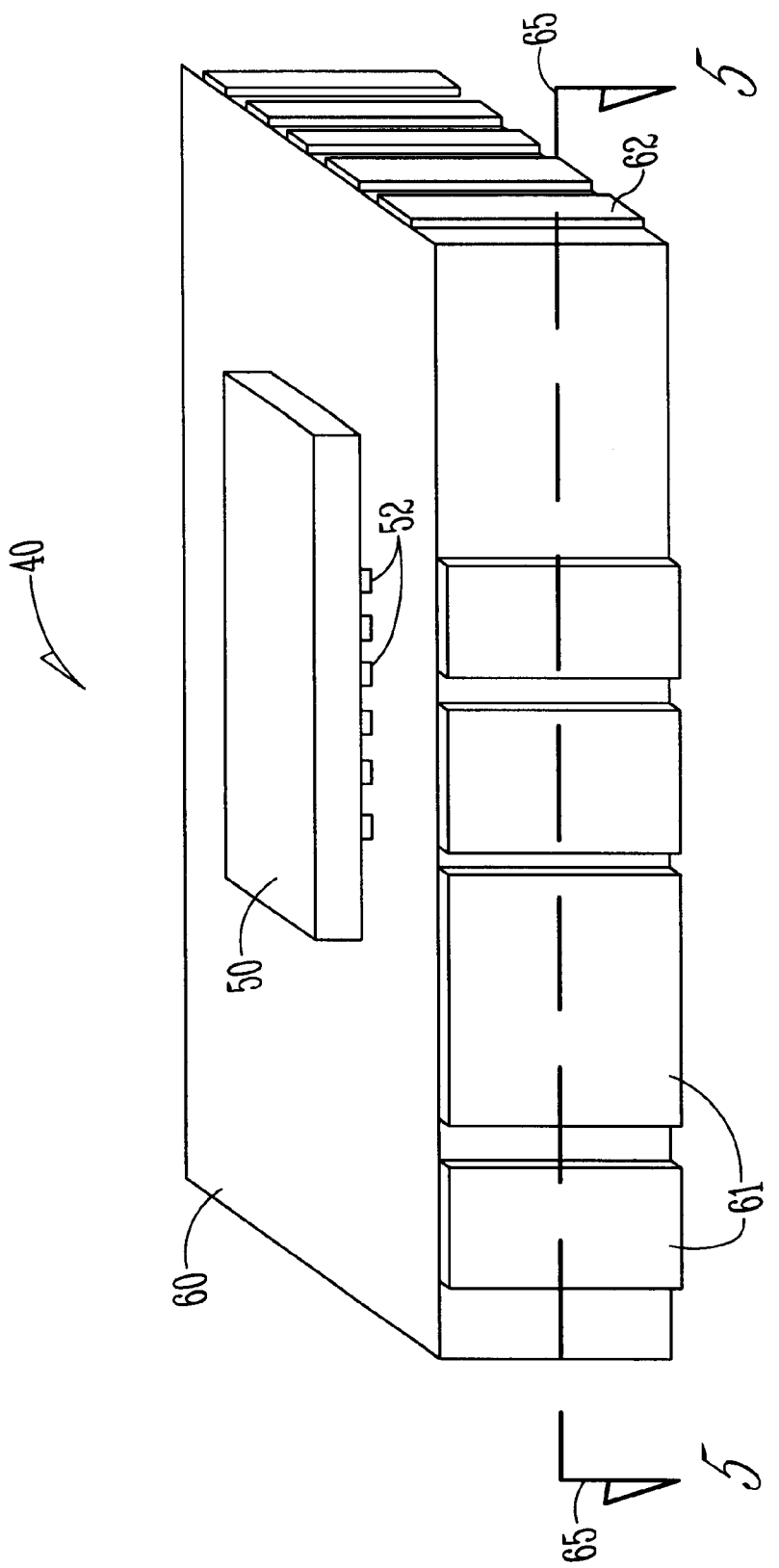
FIG. 2 is a perspective view of an IC package in accordance with one embodiment of the invention.

FIG. 2 is a perspective view of an IC package 40 in accordance with one embodiment of the invention. IC package 40 includes an IC or die 50 mounted in "flip-chip" orientation with its lands 52 facing downward to couple with corresponding lands on the upper surface of a substrate 60 through solder balls or bumps.

Substrate 60 is a multi-layer board, and it can include additional lands on its opposite surface for mating with additional packaging structure (not shown). Substrate 60 can be used for any packaging application. For example, it can form part of a chip package for packaging die 50. Alternatively, it can be part of a higher level packaging structure, such as a motherboard or printed circuit board (PCB).

As will be described in greater detail below, substrate 60 comprises a plurality of conductive trenches. As used herein, the term "trench" means a conductive plane or member, other than a via, partially or entirely extending through a substrate (typically, but not necessarily perpendicular to the upper and lower surfaces of a substrate), or being formed on an exterior sidewall of the substrate. Trenches 61 and 62, for example, are segmented, conductive planes or terminals formed on the exterior sidewalls of substrate 60. Trenches 61 and 62 can be optionally employed to couple with corresponding conductors of a socket structure that is part of an electronic assembly or electronic system. In embodiments wherein substrate 60 comprises trenches, such as trenches 61 and 62, on one or more exterior sidewalls to couple to socket conductors, the lands on the bottom of substrate 60 can be reduced or eliminated entirely.

Figure 3:
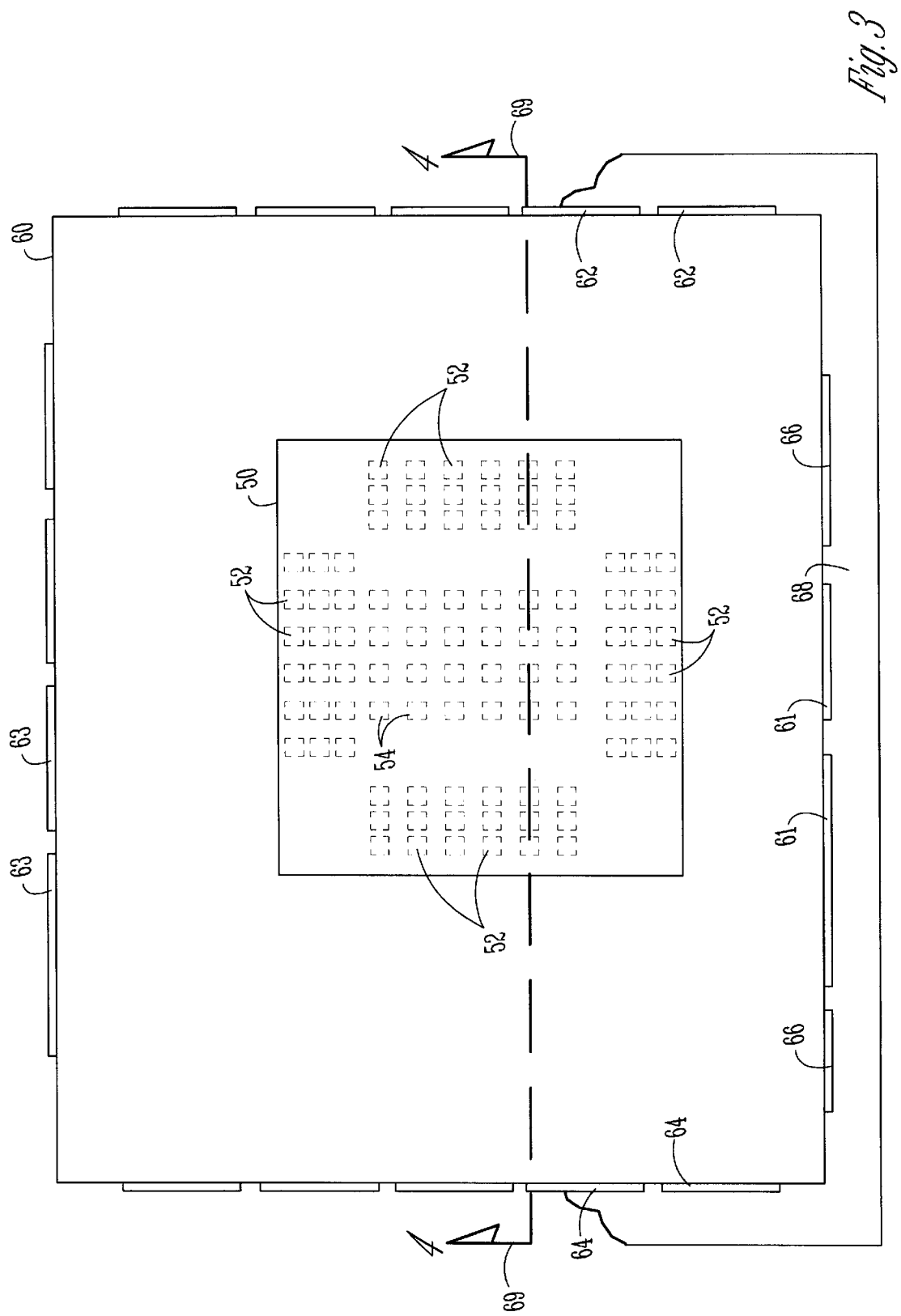
FIG. 3 illustrates a top view of the IC package shown in FIG. 2.

FIG. 3 illustrates a top view of the IC package 40 shown in FIG. 2. The IC package comprises a die 50 mounted on an organic land grid array (OLGA) substrate 60. While an OLGA substrate is shown, the present invention is not limited to use with an OLGA substrate, and any other type of substrate can be employed. The IC package illustrated in FIG. 3 can form part of electronic assembly 4 shown in FIG. 1. Die 50 can be of any type. In one embodiment, die 50 is a processor.

In FIG. 3, die 50 comprises a plurality of signal conductors (not shown) that terminate in lands 52 arranged in several rows near the periphery of the bottom surface of die 50. Die 50 also comprises a plurality of power and ground conductors (not shown) that terminate in lands 54 within the central region of die 50. Lands 52 can be coupled to corresponding lands or signal nodes (not shown) on substrate 60 by appropriate connections such as solder bumps or solder balls (56, FIG. 4). Likewise, lands 54 can be coupled to corresponding lands (not shown) on substrate 60 by appropriate connections such as solder balls (56, FIG. 4).

In FIG. 3 we are looking through die 50 at lands 52 and 54 (shown in dashed lines) on the bottom surface of die 50. Lands 52 represent signal nodes, while lands 54 represent power supply nodes. As used herein, the term power supply node refers to either a ground node (e.g. Vss) or to a power node at a potential different from ground (e.g. Vcc).

Also seen in FIG. 3 are a plurality of trenches 61–64 formed on the periphery of substrate 60. Trenches 61–64 have exposed external surfaces and are suitably formed to couple to corresponding connector structure, such as socket conductors 66, on another packaging structure 68. Trenches 61–64 typically conduct Vss or Vcc, but they can also conduct electronic signals. In one embodiment, some or all of trenches 61–64 serve to couple power and ground planes in the IC package 40 (FIG. 2) to corresponding Vss and Vcc socket conductors (e.g. socket conductors 66) on packaging structure 68. Any number of trenches 61–64 can be provided. Different numbers of trenches 61–64 can be provided on each side of substrate 60. Alternatively, trenches 61–64 can be omitted from the periphery of substrate 60.

Figure 4:
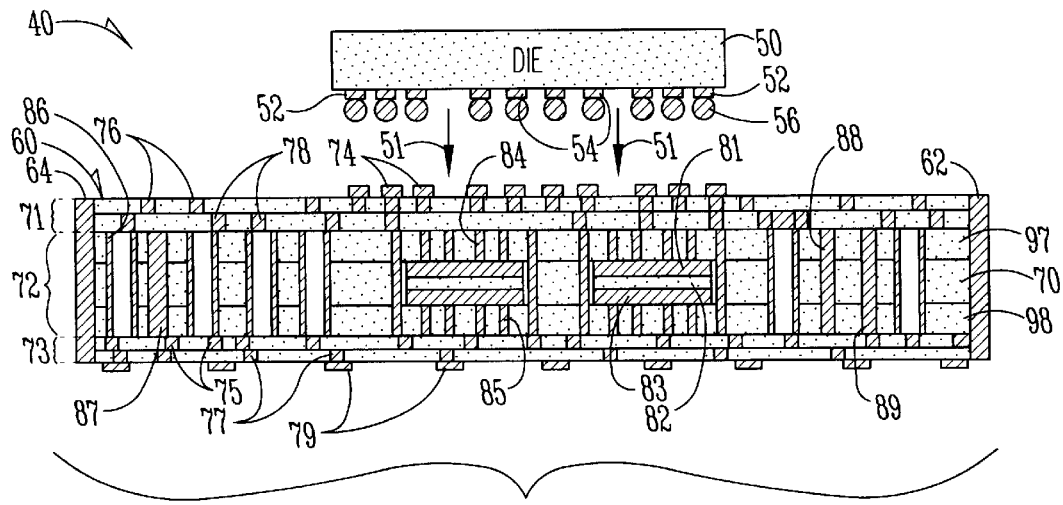
FIG. 4 illustrates a cross-sectional representation of the IC package shown in FIG. 3 taken along line 69 of FIG. 3.

FIG. 4 illustrates a cross-sectional representation of the IC package shown in FIG. 3 taken along line 69 of FIG. 3. Die 50 is coupled to substrate 60 after moving die 50 towards substrate 60 in the direction indicated by arrows 51.

Die 50 has lands 52 and 54 on its mounting surface. Solder bumps or balls 56 are used to couple lands 52 and 54 to corresponding lands 74 on the upper surface of substrate 60.

While the sequential fabrication of substrate 60 is discussed in detail below with reference to FIGS. 7–25, a description of the structure of substrate 60 may be helpful at this point. Substrate 60 comprises a central region 72, an upper buildup region 71, and a lower buildup region 73. Central region 72 includes a substrate core 70, an upper insulating layer 97, and a lower insulating layer 98. Central region 72, as well as buildup regions 71 and 73, can comprise low permittivity (Dk) material in order to enhance signal transmission speed within the substrate. Low permittivity material can include, for example, low Dk liquid crystal polymer (LCP) material, or any other suitable low Dk material. LCP material has an additional advantage in that the coefficient of thermal expansion (CTE) can be tailored to closely match the CTE of the die, thus reducing thermally-induced mechanical stresses on the die and package structure.

Buildup region 71 comprises one or more layers of insulating material. Each layer can comprise a plurality of conductive traces 76 and 78 for conducting signals, Vcc, and Vss throughout circuits that are situated between the central region 72 and the lands 74 on the upper surface of buildup region 71.

Likewise, buildup region 73 comprises one or more layers of insulating material, each comprising a plurality of conductive traces 75 and 77 for conducting signals, Vcc, and Vss throughout circuits that are situated between the central region 72 and the lands 79 on the lower surface of buildup region 73.

Central region 72 comprises a plurality of vias 86, which can be entirely or partially filled with conductive material. Vias 86 typically conduct signals through the central region 73, between signal traces situated within buildup regions 71 and 73 and/or vice versa.

Central region 72 further comprises a plurality of trenches 87–89. Central region optionally comprises one or more cavities in which correspondingly reside embedded capacitors. As seen in FIG. 4, an embedded capacitor can include upper and lower conductive elements 81 and 83, respectively, separated by a dielectric element 82. Upper conductive elements 81 are coupled to appropriate traces in buildup region 71 by way of vias 84, while lower conductive elements 83 are coupled to appropriate traces in buildup region 73 by way of vias 85.

Substrate 60 optionally includes trenches 62 and 64 formed along its periphery. While trenches 62 and 64 are illustrated as extending from the upper surface of substrate 60 to the lower surface of substrate 60, in other embodiments trenches 62 and 64 can extend only partially between the upper and lower surfaces of substrate 60, for example, along the central region 72 or along the substrate core 70.

Trenches 62 and 64 can be coupled to conductors within any region or layer of substrate 60. For example, any of trenches 61–64 (FIGS. 3 or 5) can be coupled to one or more power conductors or power planes, to one or more ground conductors or ground planes, or to one or more signal conductors.

Trenches that are not located on the periphery of substrate 60 can also be coupled to conductors within any region or layer of substrate 60. For example, any interior trench, such as trenches 87–89, can be coupled to one or more power conductors or power planes, to one or more ground conductors or ground planes, or to one or more signal conductors.

While a BGA arrangement employing solder bumps or balls 56 is illustrated in FIG. 4 for coupling die 50 to substrate 60, the present invention is not limited to use with a BGA arrangement, and it can be used with any other type of packaging technology, e.g. land grid array (LGA), chip scale package (CSP), ceramic, flex, tape, or the like. Further, the present invention is not to be construed as limited to use in C4 packages, and it can be used with any other type of IC package where the herein-described features of the present invention provide an advantage.

Figure 5:
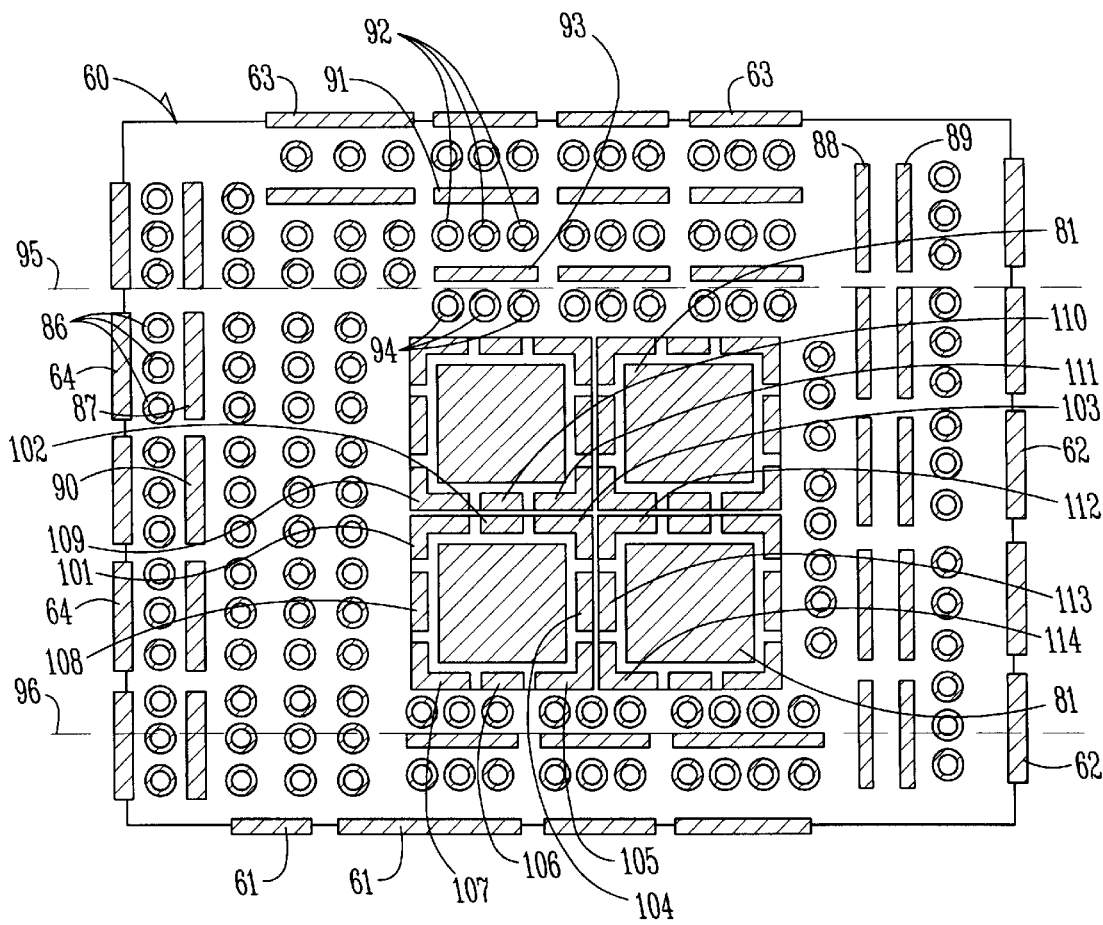
FIG. 5 illustrates a cross-sectional representation of the substrate of the IC package shown in FIG. 2 taken along line 65 of FIG. 2.

FIG. 5 illustrates a cross-sectional representation of substrate 60 of IC package 40 shown in FIG. 2 taken along line 65 of FIG. 2. Looking downward on the cross-section, the reader sees a plurality of vias such as vias 86 and 92. In this illustration, vias 92 are plated through-holes (PTH's) that can be either partially or entirely filled with electrically conductive material, such as copper or tungsten.

Also seen in FIG. 5 are a plurality of trenches in various configurations. For example, trenches 61–64 are formed around the periphery of substrate 60. Some trenches, such as trenches 87 are substantially aligned end-to-end in rows. Other trenches, such as trenches 88 and 89, are substantially aligned side-by-side. In addition, other trenches, such as trenches 91 and 93, are on either side of a group of vias 92. A "group" of vias can be any number of vias.

In addition, yet other trenches, such as trenches 101–114, are formed around the embedded capacitors, only whose upper conductive elements 81 can be seen in FIG. 5.

The various configurations of trenches used in the present invention and seen, for example, in FIG. 5 offer several significant advantages over known substrates currently in use, as will now be explained. Three significant factors in the choice and implementation of substrates relate to power delivery, inductance, and signal integrity. In typical, known packages current is carried to and from the IC by metallic (e.g. copper or aluminum) strips formed on surface of a package layer and by metallization of the sidewalls of plated through-holes (PTH's) and vias.

To meet increasingly stricter requirements of power delivery, inductance, and signal integrity in high performance IC's (such as microprocessors, microcontrollers, chipsets, and memories), smaller diameter vias, thinner traces, and higher numbers of discrete capacitors have been employed. These capacitors have been mounted on the surface of the package using known surface-mount and reflow technology. However, the greater number of capacitors utilize package space that could have otherwise been used for signal, power, and ground routing. In addition, the greater number of capacitors adds significant cost to the packages. Further, the capacitor leads and long current loops drive inductance to levels in excess of those required for optimum IC performance.

A second problem is that poor signal references, resulting from referencing PTH's in the package core, often degrade signal performance.

A third problem with the known technology is that while the number of vias is increasing, and the trace dimensions are decreasing, the current per via or trace is also increasing. When current levels increase, trace and/or via metallization can overheat, crack, or delaminate, which results in degraded performance or catastrophic failure of the IC, IC package, and/or electronic assembly.

The above-mentioned problems are substantially lessened by the present invention. First, the present invention substantially lessens inductance in the package through the use of conductive trenches. By closely spacing trenches, and by alternating power and ground trenches, inductance can be minimized through the package core. One example of alternating power and ground trenches is illustrated in FIG. 5 by trenches 88 and 89, of which either trench can carry power and the other can carry ground. Alternatively, both trenches could carry power, or both could carry ground.

Another example of alternating power and ground trenches is illustrated in FIG. 5 by trenches 101–114. Trenches 101–114 are very closed spaced. Alternating ones of trenches 101–114 carry power or ground. For example, trenches 101, 103, 105, 107, 110, and 113 can carry power, and trenches 102, 104, 106, 108, 109, 111, 112, and 114 can carry ground.

Secondly, the present invention substantially lessens signal degradation resulting from poor references. By positioning trenches adjacent to and/or surrounding one or more signal vias, reference planes are created that enhance signal integrity. An example of this is shown in FIG. 5 by trenches 91 and 93, which are positioned adjacent to and on either side of a group of signal vias 92. Signal vias, such as signal vias 92, would ordinarily be surrounded only by other signal vias. However, as indicated by FIG. 5, signal vias such as signal vias 92 can be surrounded by two conductive planes in the form of trenches 91 and 93. Both trenches in the pair of trenches 91/93 can be at ground; they can both be at power; or one can be at ground and the other at power. This provides a strip-line configuration, which contributes to a high level of signal integrity. The trenches provide electromagnetic reference planes.

In addition, a microstrip configuration can be achieved by placing a set of signal vias, such as signal vias 94, adjacent to just one trench, such as trench 93. The one trench provides an electromagnetic reference plane.

Likewise, groups of signal vias near the substrate periphery, such as signal vias 86, can be positioned adjacent to a trench 64 and a trench 87. Trenches 64 and 87 carry Vcc or Vss, depending upon what reference value signal vias 86 need.

By utilizing trenches to provide electromagnetic reference planes, the present invention lessens signal discontinuities in electrical signals traveling through signal vias, so that higher speed signals to and from the IC can be utilized, and the electronic assembly thus can provide relatively higher performance.

Thirdly, the present invention accommodates higher current values through the package, by utilizing trenches to provide DC shunts through the package. All of the trenches shown in FIG. 5 provide a low resistance path through the package for improved current carry capability.

As mentioned earlier, trenches can be provided in various configurations. For example, trenches 88/89 are positioned in a side-by-side arrangement. Trenches 87/90 are positioned in an end-to-end arrangement. Trenches 101–108 surround an embedded capacitor.

In general, for the lowest inductance, adjacent trenches are not at the same potential. Thus, for example, each trench in trench pairs 87/90 and 88/89 is at a different potential. Likewise, within a capacitor cavity, trenches 101–108 alternate in potential, and trenches from adjacent cavities, such as trenches 104 and 113, also are at different potentials; i.e., a capacitor is adjacent to alternating ones of trenches at either ground or power potentials. As an additional example, each of the trenches 61, 62, 63, and 64 located along the respective sides of substrate 60 can be at a different potential from that of its neighbors along the same side of substrate 60.

While the embodiment depicted in FIG. 5 illustrates a variety of different trenches in a variety of different trench configurations, it will be understood that in other embodiments more or fewer trenches and/or trench configurations can be provided. For example, in one embodiment, trenches 61–64 at the substrate periphery are omitted. Similarly, in another embodiment, capacitors 81 and the trenches surrounding them, such as trenches 101–108, are omitted.

In addition, while trenches have been illustrated in an orthogonal pattern within substrate 60, they could be formed within substrate 60 at various angles other than 90 degrees (such as but not limited to 45 degrees) with respect to the top, bottom, and sides of substrate 60, or with respect to other trenches.

Figure 6:
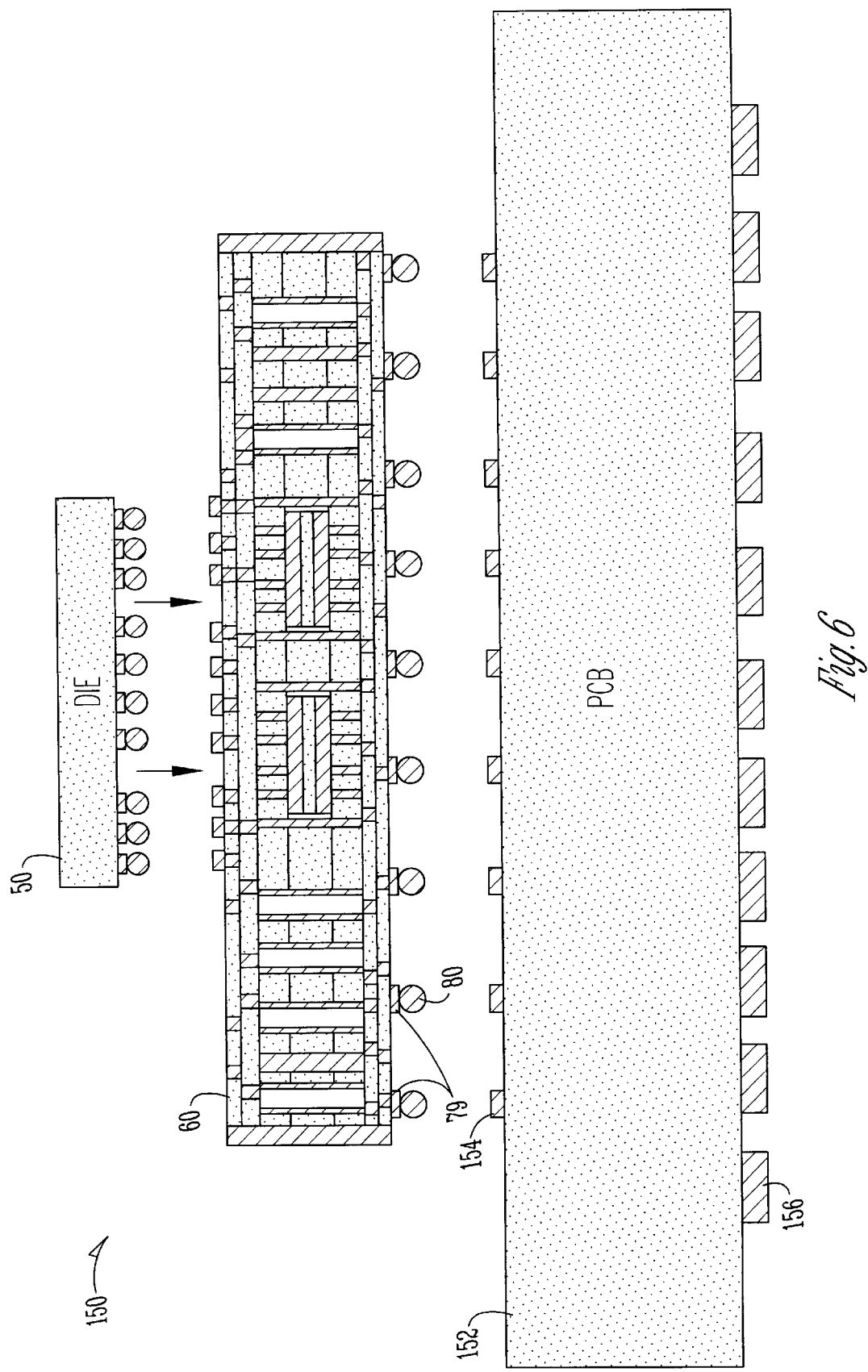
FIG. 6 illustrates a cross-sectional representation of an electronic assembly that includes an IC package substrate, in accordance with an embodiment of the invention.

FIG. 6 illustrates a cross-sectional representation of an electronic assembly 150 that includes an IC package substrate 60, in accordance with an embodiment of the invention. The electronic assembly 150 comprises a die 50 mounted on a substrate 60. Die 50 can be of any type. In one embodiment, die 50 is a processor. Substrate 60 is a multi-layer substrate. Substrate 60 in this configuration can be referred to as an interposer.

Substrate 60 can be mounted to an additional substrate 152, such as a printed circuit board (PCB) or card. Substrate 60 can comprise, for example, a plurality of lands 79 that are positioned to be mechanically and electrically coupled to corresponding lands 154 of substrate 152 by suitable connectors such as ball grid array (BGA) solder balls 80.

As mentioned earlier, in embodiments wherein substrate 60 comprises trenches on one or more exterior sidewalls, such as trenches 62 and 64 (FIG. 4), to couple to socket conductors, the lands 79 on the bottom of substrate 60 can be reduced or eliminated entirely. In one embodiment, IC package 40 (FIG. 4) is coupled entirely through such exterior trenches to a mating socket on additional substrate 152.

While a BGA arrangement is illustrated in FIG. 6 for coupling substrate 60 to substrate 152, the present invention is not limited to use with a BGA arrangement, and it can be used with any other type of packaging technology. Further, the present invention is not to be construed as limited to use in C4 packages, and it can be used with any other type of IC package where the herein-described features of the present invention provide an advantage.

FABRICATION

FIGS. 7–10 are cross-sectional representations illustrating stages of fabricating an IC package substrate, in accordance with an embodiment of the invention While the fabrication of an IC package substrate is illustrated, the present invention can be used in other types of substrates, such as motherboards and PCB's.

FIG. 7 illustrates a substrate core 70. Substrate core 70 can be made of any suitable material. In the embodiment illustrated in the fabrication sequence below, it is made of an organic material.

The substrate core 70, insulating layers 97 and 98, and buildup regions 71 and 73 of substrate 60 (FIG. 4) can be fabricated by conventional organic buildup techniques. For example, they can be fabricated from materials such as epoxies, acrylates, polyimides, polyurethanes, polysulfides, resin-glass weave (e.g. FR-4), nylons, and other similar materials. The layers can be constructed using familiar equipment for extruding, coating, spinning on, spraying, screen-printing, stenciling, and doctor-blading. Coating equipment such as a meniscus coater or curtain coater could be used.

If substrate 60 is fabricated of ceramic, conventional ceramic techniques can be used, such as but not limited to high temperature co-fired ceramic (HTCC) technology, high thermal coefficient of expansion (HITCE) technology, or glass ceramic technology. To ensure low equivalent series resistance (ESR) values, a low temperature silver or copper compatible co-fired ceramic technology may be used.

FIG. 8 illustrates substrate core 70 after vias 131 are formed therein. Vias 131 can be formed in substrate core 70 using techniques that are well known to those of ordinary skill in the art. For example, vias 131 can be drilled or punched. Alternatively, vias 131 can be formed by imprinting or microperforation techniques.

FIG. 9 illustrates substrate core 70 after trenches 132 and capacitor cavities 133 are formed therein. Trenches 132 and capacitor cavities can be formed in substrate 70 using techniques that are well known to those of ordinary skill in the art. For example, trenches 132 and cavities 133 can be drilled or punched. Alternatively, they can be formed by imprinting or microperforation techniques.

After this stage, vias 131, trenches 132, and cavities 133 are thoroughly cleaned using plasma or other known cleaning techniques.

FIG. 10 illustrates substrate core 70 after vias 131, trenches 132, and the sidewalls 134 of cavities 133 have been filled or coated with electrically conductive material, such as but not limited to copper or tungsten, using techniques that are well known to those of ordinary skill in the art. While vias 131 are generally illustrated herein as having only their interior walls plated, vias 131 can alternatively be completely filled, or some vias 131 can be partially filled while others can be completely filled.

Figure 11:
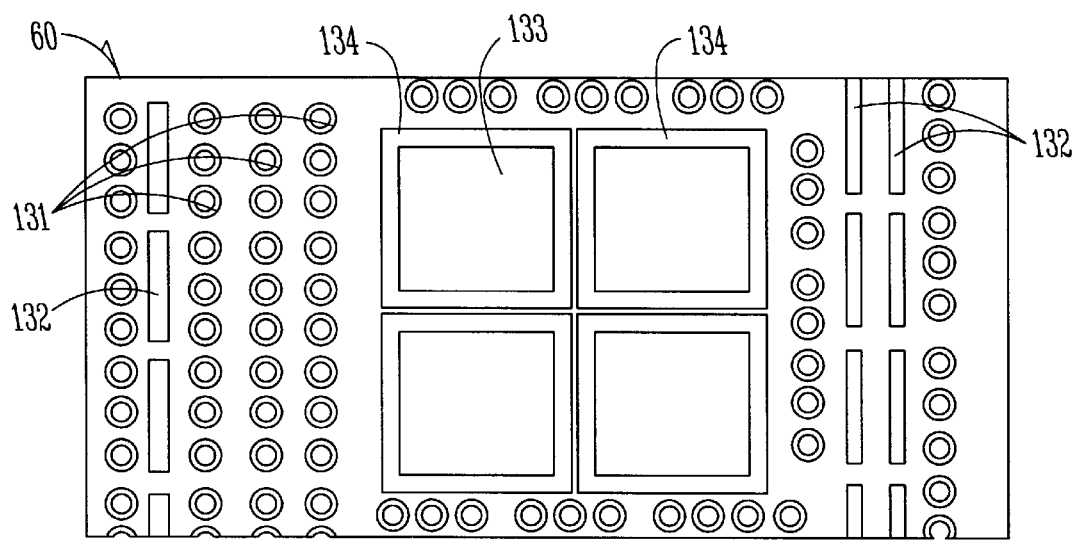
FIG. 11 is a top view of the IC package fabrication stage shown in FIG. 10.

FIG. 11 is a top view of the IC package fabrication stage shown in FIG. 10. FIG. 11 illustrates more clearly the plated sidewalls 134 of capacitor cavities 133.

Figure 12:
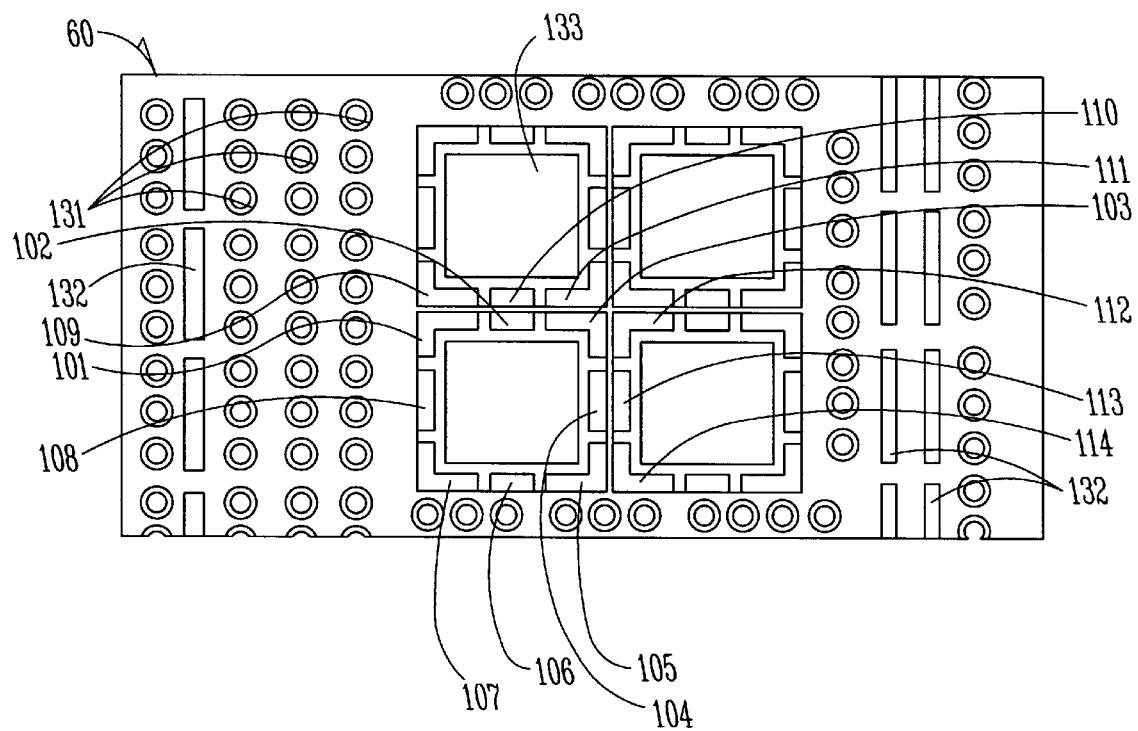
FIG. 12 is a top view of an IC package fabrication stage subsequent to that shown in FIG. 11.

FIG. 12 is a top view of an IC package fabrication stage subsequent to that shown in FIG. 11. Sidewalls 134 of capacitor cavities 133 have been segmented into individual conductive trenches, such as trenches 101–114. While eight trenches have been formed within each capacitor cavity 133 in the embodiment illustrated, more or fewer trenches could be formed. Sidewalls 134 are separated into individual trenches 101–114 through conventional subtractive techniques, such as etching or drilling. At this stage, each trench 101–114 is electrically isolated from its neighbor, both within the same cavity 133 and within any adjoining cavity 133. Likewise, each trench 132 is electrically isolated from each other trench 132.

FIGS. 13–21 are cross-sectional representations illustrating additional stages of fabricating an IC package substrate, in accordance with an embodiment of the invention. In general, FIGS. 13–16 illustrate operations that form the substrate central region 72 (FIG. 4), while FIGS. 17–21 illustrate the operations that form the upper buildup region 71 and lower buildup region 73 (FIG. 4).

Figure 13:
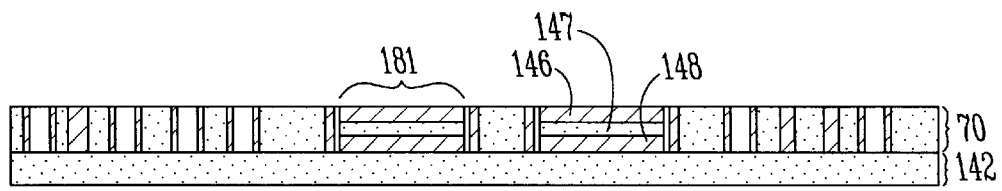
FIG. 13–21 are cross-sectional representations illustrating additional stages of fabricating an IC package substrate, in accordance with an embodiment of the invention p

FIG. 13 illustrates the substrate core after capacitors 181 have been inserted or fabricated in capacitor cavities 133 (FIG. 12). Each capacitor 133 comprises an upper conductive layer 146, a dielectric layer 147, and a lower conductive layer 148. In the embodiment shown, discrete capacitors 181 are inserted into cavities 133. A number of alternative embodiments are possible. For example, other types of discrete capacitors can be used than the type shown.

Various types of suitable discrete capacitors, suitable methods for embedding them with substrates, and suitable electrical contacts for coupling them to the electrical structure of the package, are described for example in Related Invention Ser. No. 09/540,707.

Moreover, capacitors, such as but not limited to planar chip capacitors or ceramic capacitors, can be fabricated within cavities 133 using, for example, the techniques described in Related Invention Ser. No. 09/606,882.

Also illustrated in FIG. 13 is the addition of a lower insulating or dielectric layer 142, (which corresponds to insulating layer 98 shown in FIG. 4).

Figure 14:
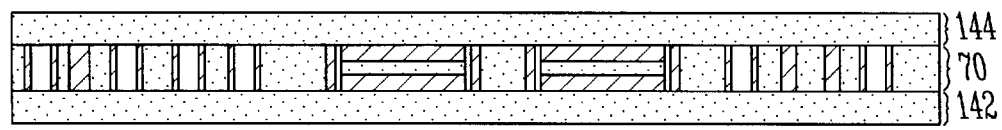

FIG. 14 illustrates the substrate core structure after an upper insulating layer 144 has been formed on substrate core 70.

Figure 15:
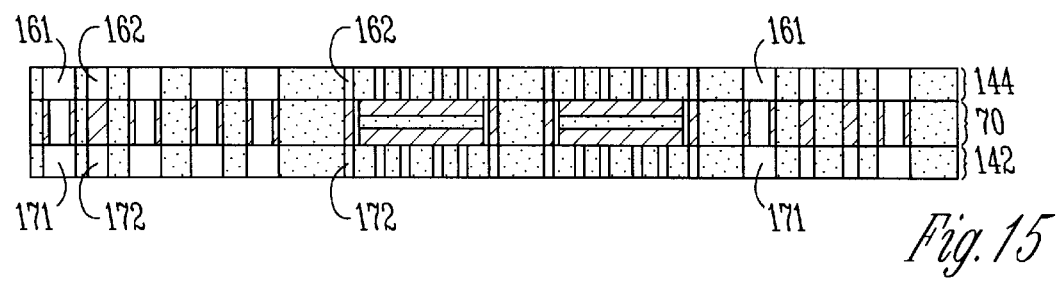

FIG. 15 illustrates the substrate core structure after vias 161 and trenches 162 have been formed in upper insulating layer 144, and after vias 171 and trenches 172 have been formed in lower insulating layer 142. The vias and trenches can be formed using the techniques mentioned earlier.

Figure 16:
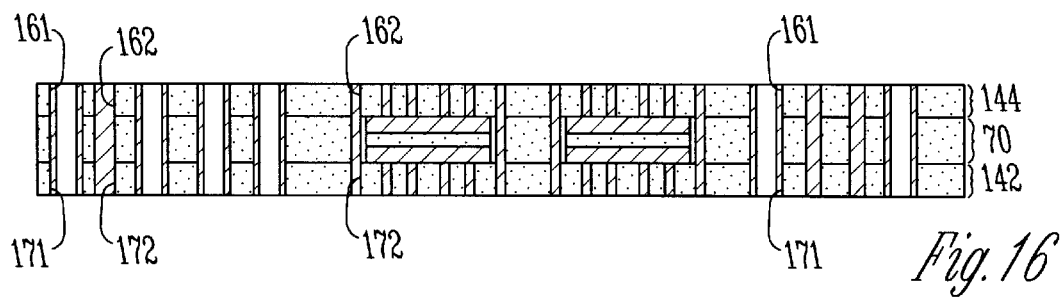

FIG. 16 illustrates the substrate core structure after metallization of vias 161/171 and trenches 162/172.

Figure 17:
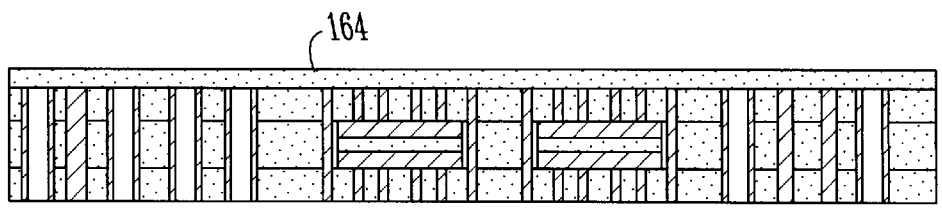

FIG. 17 illustrates the substrate core structure after formation of a first insulating layer 164 thereon for the upper buildup region 71 (FIG. 4).

Figure 18:
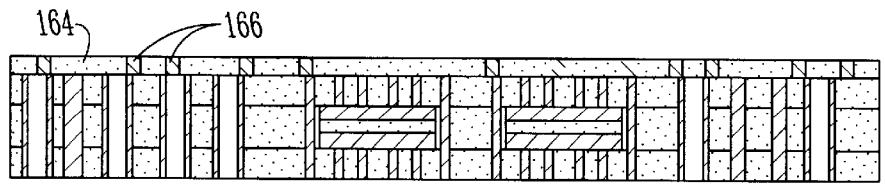

FIG. 18 illustrates the formation of conductive traces 166 in insulating layer 164 of upper buildup region 71 (FIG. 4). Conductive traces 166 can be formed in insulating layer 164 using additive or subtractive techniques that are well known to those of ordinary skill in the art.

Figure 19:
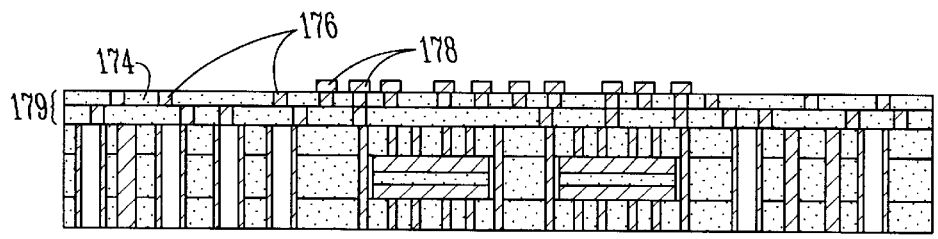

FIG. 19 illustrates the formation of an additional insulating layer 174 having conductive traces 176 therein for the upper buildup region 179 (corresponding to upper buildup region 71 of FIG. 4). In addition, connection nodes or lands 178 have been formed in or upon insulating layer 174.

Figure 20:
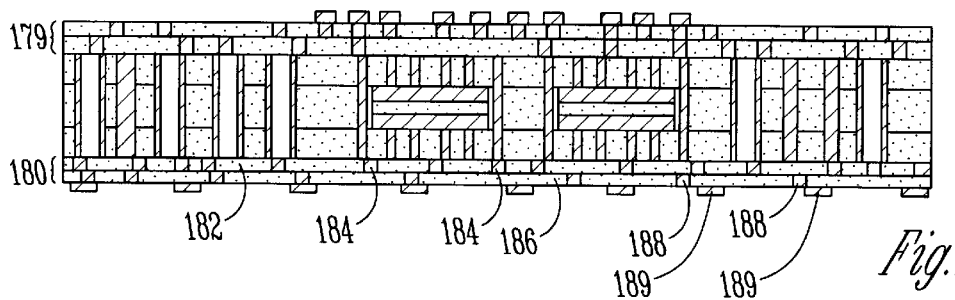

FIG. 20 illustrates the formation of lower buildup region 180 (corresponding to lower buildup region 73 of FIG. 4) comprising insulating layer 182 having traces 184; insulating layer 186 having traces 188; and lands 189. Lower buildup region 180 can be fabricated in any suitable manner. For example, it can be fabricated before, during, or after the fabrication of upper buildup region 179.

The above description of the fabrication of one embodiment of the invention has been considerably simplified for purposes of illustration. It will be understood by those of ordinary skill in the art that ground and power planes can also be fabricated within any portion(s) of the substrate. In one embodiment, these are implemented by conductive layers that are coupled to Vcc or Vss in an alternating manner within the substrate, although other arrangements of ground and power planes can also be built. In one embodiment, the ground and power planes can have the structures, and be fabricated, as described in the above-mentioned Related Invention entitled "An Electronic Assembly Providing Shunting of Electrical Current".

Figure 21:
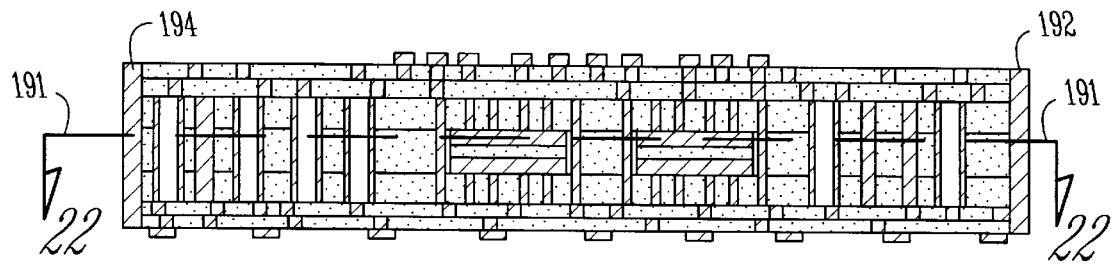

FIG. 21 illustrates the substrate structure after metallization of the periphery, as depicted by metallized trenches 192 and 194. These are also depicted in FIG. 22 described immediately below.

Figure 22:
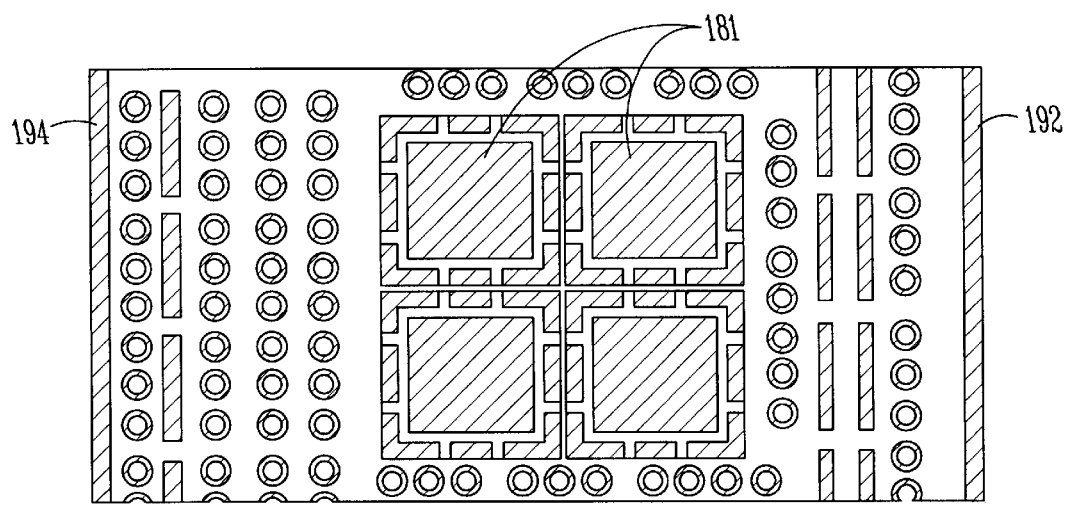
FIG. 22 is a top view of a cross-section of the IC package fabrication stage shown in FIG. 21 taken along line 191 of FIG. 21.

FIG. 22 is a top view of a cross-section of the IC package fabrication stage shown in FIG. 21 taken along line 191 of FIG. 21. Metallized trenches 192 and 194 are seen prior to their segmentation.

Figure 23:
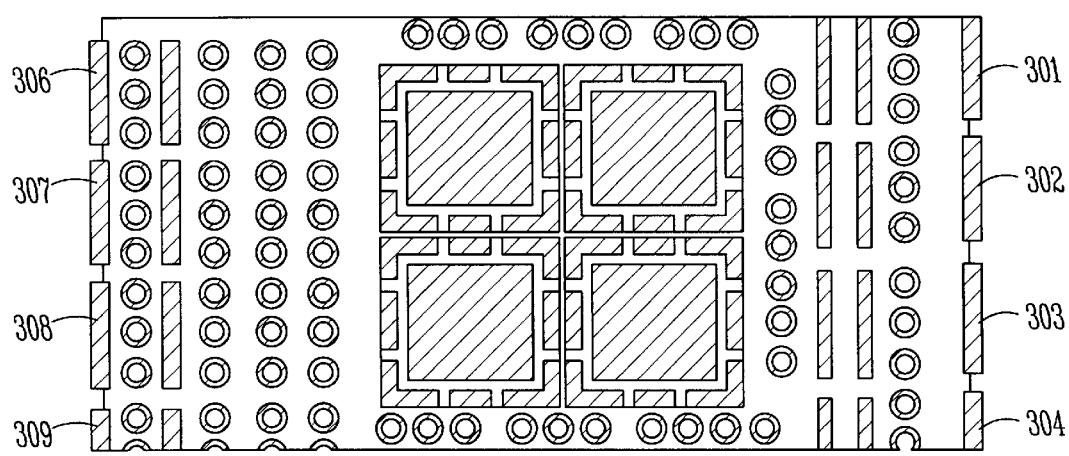
FIG. 23 is a top view of an IC package fabrication stage subsequent to that shown in FIG. 21.

FIG. 23 is a top view of an IC package fabrication stage subsequent to that shown in FIG. 21. In FIG. 23 unsegmented trench 192 has been segmented into a plurality of trenches 301–304, and unsegmented trench 194 has been segmented into a plurality of trenches 306–309. Likewise, but not illustrated in FIG. 23, a plurality of trenches 61 and 63 can be formed along the bottom and top, respectively, of the substrate 60 (refer to FIG. 5).

One method for fabricating a substrate comprising trench structures for providing improved power delivery and signal integrity will now be described.

Figure 24:
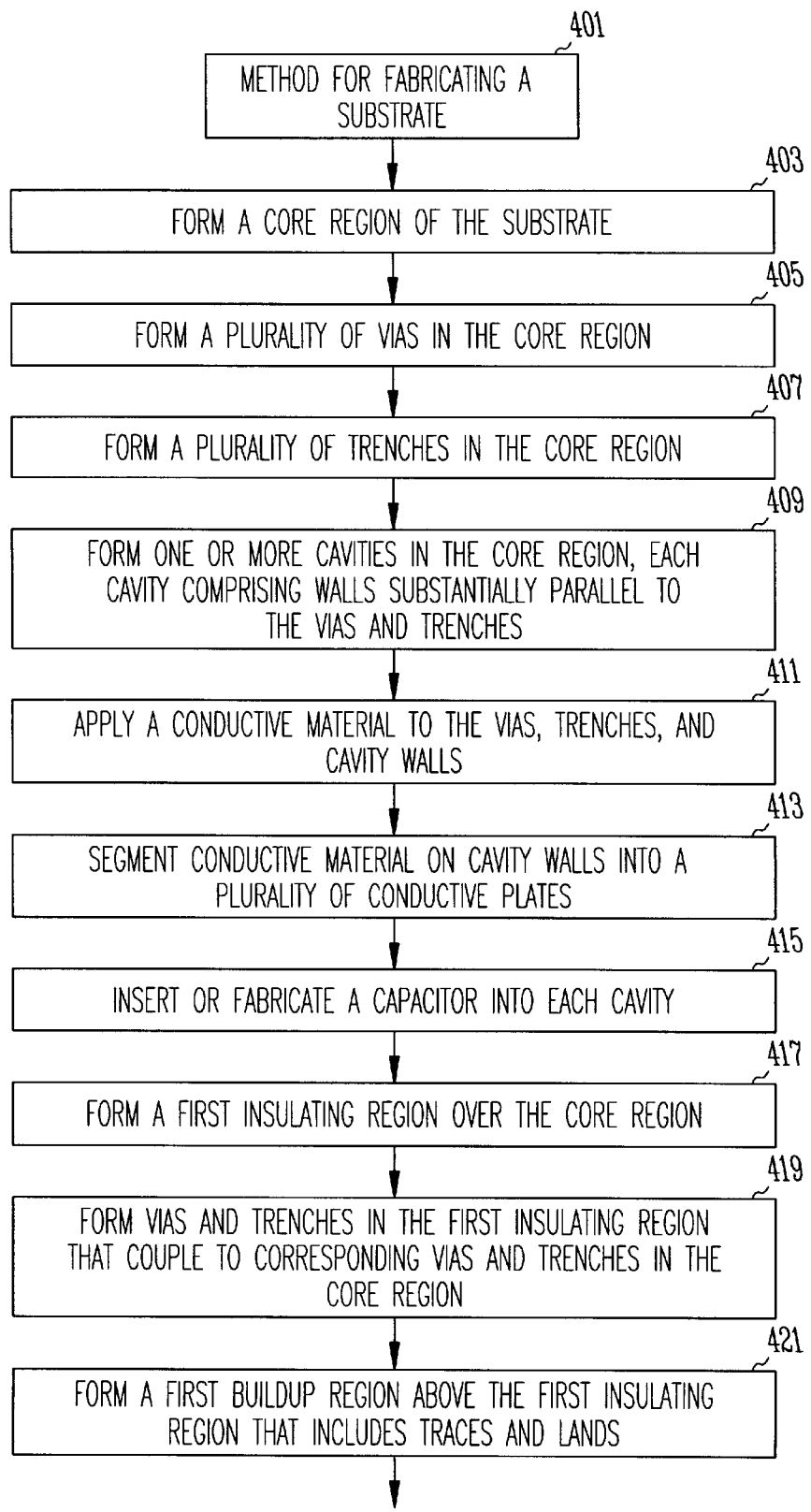
FIGS. 24 and 25 together illustrate a flow diagram of a method of fabricating a substrate; in accordance with one embodiment of the invention.
Figure 25:
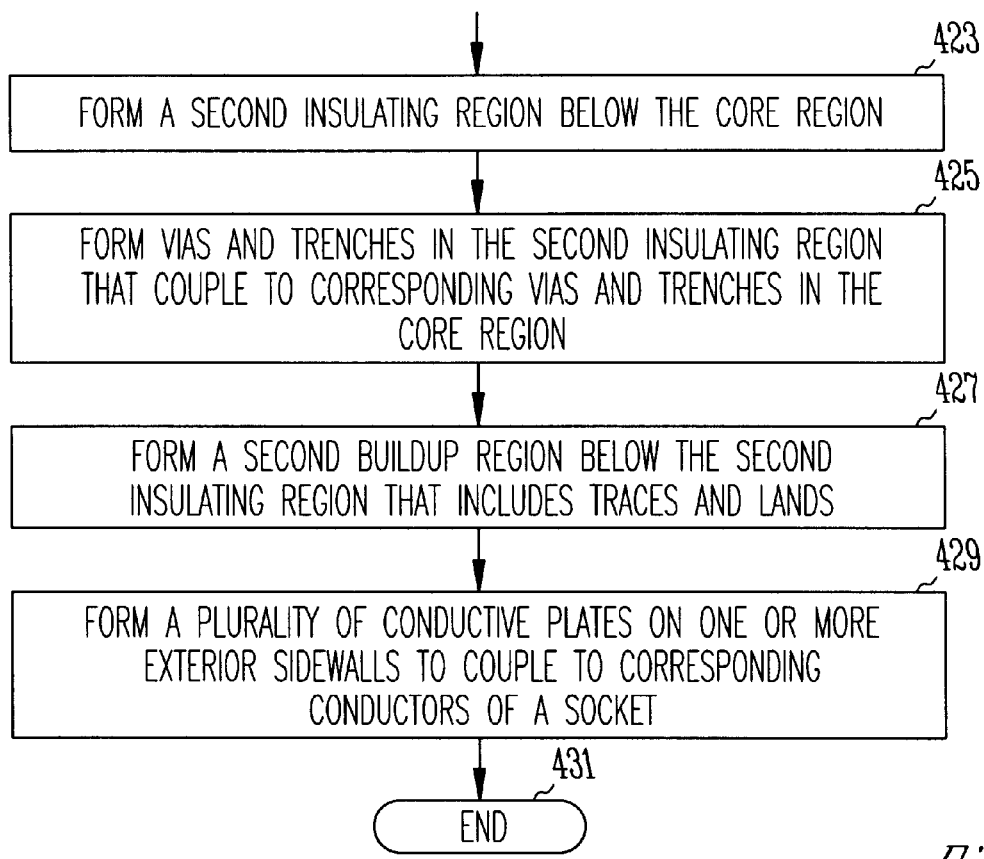

FIGS. 24 and 25 together illustrate a flow diagram of a method 401 of fabricating a substrate, in accordance with one embodiment of the invention. The sequence of fabrication operations differs in some respects from that described with reference to FIGS. 7–23, in part to illustrate that many different fabrication sequences are possible.

In 403, a core region is formed, e.g. substrate core 70 (FIG. 7).

In 405, a plurality of vias (e.g. vias 131, FIG. 8) are formed in the core region.

In 407, a plurality of trenches (e.g. trenches 132, FIG. 9) are formed in the core region.

In 409, one or more cavities (e.g. cavities 133, FIG. 9) are formed in the core region. In one embodiment, each cavity comprises sidewalls that are substantially parallel to the sidewalls of the vias and trenches.

In 411, a conductive material is applied to the vias, trenches, and cavity walls, as depicted for example in FIG. 10.

In 413, the conductive material on the cavity walls is segmented into a plurality of conductive plates or trenches, as depicted for example in FIG. 12.

In 415, a capacitor is inserted into or fabricated within each cavity, as depicted for example in FIG. 13.

In 417, a first insulating region is formed over the core region, as depicted for example by insulating layer 144 in FIG. 14.

In 419, vias and trenches are formed in the first insulating region. These vias and trenches couple to corresponding vias and trenches in the core region, as depicted for example in FIG. 15.

In 421, a first buildup region (e.g. buildup region 179, FIG. 19) is formed above the first insulating region. The first buildup region includes traces and lands, as depicted for example by traces 166 and 176 and lands 178 in FIGS. 18–19.

In 423, a second insulating region is formed below the core region, as depicted for example by insulating layer 142 in FIG. 13.

In 425, vias and trenches are formed in the second insulating region. These vias and trenches couple to corresponding vias and trenches in the core region, as depicted for example in FIG. 15.

In 427, a second buildup region (e.g. buildup region 180, FIG. 20) is formed below the second insulating region. The second buildup region includes traces and lands, as depicted for example by traces 184 and 188 and lands 189 in FIG. 20.

In 429, a plurality of conductive plates or trenches are formed on one or more exterior sidewalls of the substrate structure, as depicted for example by conductive plates or trenches 301–304 and 306–309 in FIG. 23. These conductive plates or trenches can be employed, for example, to couple to corresponding conductors of a socket (e.g. socket conductors 66, FIG. 3) within another packaging structure, such as packaging structure 68 (FIG. 3). Socketable IC packages are commercially attractive, because they enable IC packages to be readily tested, replaced, and/or upgraded.

The method ends at 431.

The operations described above with respect to the methods illustrated in FIGS. 7–25 can be performed in a different order from those described herein.

The above-described and illustrated details relating to the composition, dimensions, number, and order of layers and their constituent parts are merely exemplary of the embodiments illustrated, and they are not meant to be limiting. The above-described and illustrated choice of materials; geometry; number, order, dimensions, and composition of layers; mechanisms for affixing; and assembly sequencing can all be varied by one of ordinary skill in the art to optimize the performance of the package.

Any suitable method, or combination of different methods, for depositing the electrically conductive materials can be used, such as plating, sputtering, vapor, electrical, screening, stenciling, chemical including chemical vapor deposition (CVD), vacuum, and so forth.

The particular implementation of the package is very flexible in terms of the orientation, size, number, order, and composition of its constituent elements. Various embodiments of the invention can be implemented using various combinations of substrate technology to achieve the advantages of the present invention. The structure, including types of materials used, dimensions, layout, geometry, and so forth, of the package can be built in a wide variety of embodiments, depending upon the requirements of the electronic assembly of which it forms apart.

FIGS. 1–23 are merely representational and are not drawn to scale. Certain proportions thereof may be exaggerated, while others may be minimized. The drawings are intended to illustrate various implementations of the invention that can be understood and appropriately carried out by those of ordinary skill in the art.

CONCLUSION

The present invention provides for a substrate for an electronic assembly and methods of manufacture thereof that minimize problems associated with high power delivery. An electronic system and/or data processing system that incorporates one or more electronic assemblies that utilize the present invention can handle the relatively high power densities and clock frequencies associated with high performance integrated circuits, and such systems are therefore more commercially attractive.

By substantially increasing current delivery, lowering inductance, and providing improved signal references, in substrates used for high performance IC's, such electronic equipment can be operated at increased clock frequencies and with higher reliability.

As shown herein, the present invention can be implemented in a number of different embodiments, including a substrate, an integrated circuit package, an electronic assembly, an electronic system in the form of a data processing system, and various methods of fabricating a substrate. Other embodiments will be readily apparent to those of ordinary skill in the art. The elements, materials, geometries, dimensions, and sequence of operations can all be varied to suit particular packaging requirements.

While certain operations have been described herein relative to "upper" or "above", or to "lower" or "below", it will be understood that these descriptors are relative, and that they would be reversed if the substrate or package were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A substrate for mounting an integrated circuit comprising:
a plurality of layers, at least some of the layers comprising a plurality of traces, vias, and trenches;
a first plurality of lands on a first surface thereof and coupled to a first group of traces, vias, and trenches; and
a second plurality of lands on a second surface thereof and coupled to a second group of traces, vias, and trenches.

2. The substrate recited in claim 1, wherein the substrate comprises a core region, and wherein the trenches are in the core region.

3. The substrate recited in claim 1, wherein at least one trench is formed with an exposed surface thereof along the periphery of the substrate.

4. The substrate recited in claim 1, wherein at least one of the first plurality of lands and one of the second plurality of lands are to couple to a first potential, wherein at least another one of the first plurality of lands and another one of the second plurality of lands are to couple to a second potential, wherein a first trench is to conduct the first potential, and wherein a second trench is to conduct the second potential.

5. The substrate recited in claim 4, wherein a first group of vias are to conduct electrical signals, and wherein the first group of vias is adjacent to the first trench.

6. The substrate recited in claim 5, wherein the first trench provides a reference plane for electrical signals conducted by the first group of vias.

7. The substrate recited in claim 5, wherein the first group of vias is also adjacent to the second trench.

8. The substrate recited in claim 7, wherein the second trench provides a reference plane for electrical signals conducted by the first group of vias.

9. The substrate recited in claim 4 and further comprising at least one embedded capacitor adjacent to the first trench and to the second trench.

10. The substrate recited in claim 4 and further comprising a first group of trenches to conduct the first potential, and a second group of trenches to conduct the second potential, and wherein at least one embedded capacitor is adjacent to the first and second groups of trenches.

11. The substrate recited in claim 10, wherein the at least one embedded capacitor is adjacent to alternating ones of the first and second groups of trenches.

12. The substrate recited in claim 11, wherein a plurality of embedded capacitors are adjacent to alternating ones of the first and second groups of trenches.

13. The substrate recited in claim 12, wherein a portion of the plurality of embedded capacitors are adjacent to one another, and wherein adjacent trenches between adjacent capacitors are from different ones of the first and second groups of trenches.

14. The substrate recited in claim 4, wherein the first and second trenches are substantially parallel to one another.

15. The substrate recited in claim 14, wherein the first and second trenches are adjacent to one another.

16. A substrate for mounting an integrated circuit comprising:
a plurality of non-conductive layers, at least some of the layers comprising a plurality of traces, vias, and trenches; and
a plurality of lands on a surface thereof and coupled to a group of the traces, vias, and trenches;
wherein at least one of the plurality of lands is to couple to a first potential, wherein at least another one of the first plurality of lands is to couple to a second potential, wherein a first group of trenches is to conduct the first potential; and wherein a second group of trenches is to conduct the second potential.

17. The substrate recited in claim 16, wherein trenches from the first group of trenches are adjacent one another.

18. The substrate recited in claim 16, wherein the first and second groups of trenches provide electromagnetic reference planes.

19. The substrate recited in claim 16, wherein the substrate comprises a core region, and wherein the trenches are in the core region.

20. The substrate recited in claim 19, wherein the first and second groups of trenches provide direct current paths through the core region.

21. The substrate recited in claim 16, wherein the first and second groups of trenches are distributed substantially throughout the substrate, with a portion of the trenches being substantially parallel to a first edge of the substrate, and with a further portion of the trenches being substantially parallel to a second edge of the substrate that is orthogonal to the first edge.

22. The substrate recited in claim 16, wherein trenches alternatively from the first and second groups are substantially aligned end-to-end.

23. The substrate recited in claim 22, wherein the trenches include trenches with exposed surfaces thereof along the periphery of the substrate to couple to corresponding conductors of a socket.

24. The substrate recited in claim 22, wherein at least one embedded capacitor is substantially surrounded by the trenches that are substantially aligned end-to-end.

25. The substrate recited in claim 16, wherein trenches within the first group are substantially aligned end-to-end.

26. The substrate recited in claim 16, wherein trenches within the first and second groups are substantially aligned end-to-end.

27. The substrate recited in claim 16, wherein trenches alternatively from the first and second groups are substantially aligned side-by-side.

28. The substrate recited in claim 27, wherein at least two embedded capacitors are on either side of the trenches that are substantially aligned side-by-side.

29. The substrate recited in claim 28, wherein each of the at least two embedded capacitors is within a cavity, and wherein the trenches that are substantially aligned side-by-side are each within a respective cavity.

30. The substrate recited in claim 16, wherein trenches within the first group are substantially aligned side-by-side.

31. The substrate recited in claim 16, wherein trenches within the first and second groups are substantially aligned side-by-side.

32. The substrate recited in claim 16, wherein a first group of vias is to conduct electrical signals, and wherein the first group of vias is between trenches from the first group.

33. The substrate recited in claim 32, wherein the trenches provide an electromagnetic reference plane for the first group of vias.

34. The substrate recited in claim 16, wherein a first group of vias are to conduct electrical signals, and wherein the first group of vias is adjacent to at least one trench from the first group.

35. The substrate recited in claim 34, wherein the at least one trench provides an electromagnetic reference plane for the first group of vias.

36. The substrate recited in claim 16, wherein at least one trench within the first group has an exposed surface along the periphery of the substrate to couple to a conductor of a socket.

37. The substrate recited in claim 16, wherein at least one trench within the first group and at least one trench within the second group have exposed surfaces along the periphery of the substrate to couple to corresponding conductors of a socket.

38. An electronic package comprising:
a substrate comprising:
a plurality of non-conductive layers, at least some of the layers comprising a plurality of traces, vias, and trenches; p2 a first plurality of lands on a first surface thereof and coupled to a first group of traces, vias, and trenches; and
a second plurality of lands on a second surface thereof and coupled to a second group of traces, vias, and trenches;
wherein at least one of the first plurality of lands and one of the second plurality of lands are to couple to a first potential, wherein at least another one of the first plurality of lands and another one of the second plurality of lands are to couple to a second potential, wherein a first group of trenches is to conduct the first potential; and wherein a second group of trenches is to conduct the second potential; and
an integrated circuit coupled to the first plurality of lands.

39. The electronic package recited in claim 38, wherein the substrate comprises a core region, and wherein the first and second groups of trenches provide direct current paths through the core region.

40. The electronic package recited in claim 38, wherein the first and second groups of trenches include trenches with exposed surfaces thereof along the periphery of the electronic package to couple to corresponding conductors of a socket.

41. The electronic package recited in claim 38, wherein a first group of vias are to conduct electrical signals, and wherein the first group of vias is adjacent to at least one trench.

42. The electronic package recited in claim 38, wherein the lands of the second plurality of lands to couple to the first and second potential, respectively, are positioned to be coupled to corresponding nodes at the first and second potential of an additional substrate subjacent to the substrate.

43. An electronic system comprising:
a bus coupling components in the electronic system;
a display coupled to the bus;
external memory coupled to the bus; and
a processor coupled to the bus and comprising an electronic assembly including:
a substrate comprising:
a plurality of non-conductive layers, at least some of the layers comprising a plurality of traces, vias, and trenches;
a first plurality of lands on a first surface thereof and coupled to a first group of traces, vias, and trenches; and
a second plurality of lands on a second surface thereof and coupled to a second group of traces, vias, and trenches;
wherein at least one of the first plurality of lands and one of the second plurality of lands are to couple to a first potential, wherein at least another one of the first plurality of lands and another one of the second plurality of lands are to couple to a second potential, wherein a first group of trenches is to conduct the first potential; and wherein a second group of trenches is to conduct the second potential; and
an integrated circuit coupled to the first plurality of lands.

44. The electronic system recited in claim 43, wherein the substrate comprises a core region, and wherein the first and second groups of trenches provide direct current paths through the core region.

45. The electronic system recited in claim 43, wherein the first and second groups of trenches include trenches with exposed surfaces thereof along the periphery of the electronic assembly to couple to corresponding conductors of a socket of the electronic system.

46. A method for fabricating a substrate, the method comprising:

forming a core region of the substrate;

forming a plurality of vias in the core region;

forming a plurality of trenches in the core region;

applying a conductive material to the vias and trenches; and forming a first buildup region above the core region.

47. The method recited in claim 46, the method further comprising:

forming a first insulating region between the core region and the first buildup region; and forming vias and trenches in the first insulating region that couple to vias and trenches in the core region.

48. The method recited in claim 46, the method further comprising:

forming a second buildup region below the core region.

49. The method recited in claim 48, the method further comprising:

forming a second insulating region between the core region and the second buildup region; and forming vias and trenches in the second insulating region that couple to vias and trenches in the core region.

50. The method recited in claim 46, the method further comprising:

forming at least one cavity in the core region, the at least one cavity comprising walls substantially parallel to the vias and trenches;

forming a plurality of conductive plates on the walls of the at least one cavity; and providing a capacitor in the at least one cavity.

51. The method recited in claim 46, wherein the substrate comprises a plurality of exterior sidewalls, the method further comprising:

forming a plurality of conductive plates on at least one of the exterior sidewalls, at least a portion of the conductive plates comprising surfaces to couple to corresponding conductors of a socket of an electronic assembly.

52. The method recited in claim 46, wherein the substrate comprises a plurality of exterior sidewalls, the method further comprising:

forming a power plane and a ground plane within the substrate; and forming a plurality of conductive plates, located on one or more of the exterior sidewalls, a first conductive plate being coupled to the power plane, a second conductive plate being coupled to the ground plane, the first and second conductive plates comprising surfaces to couple to corresponding power and ground conductors of a socket of an electronic assembly.

* * * * *